(12) United States Patent
Kim et al.

(10) Patent No.: US 10,317,211 B2
(45) Date of Patent: Jun. 11, 2019

(54) ROBUST INERTIAL SENSORS

(71) Applicants: Robert Bosch GmbH, Stuttgart (DE); Bongsang Kim, Mountain View, CA (US); Ando Feyh, Reutlingen (DE); Andrew Graham, Redwood City, CA (US); Gary O'Brien, Palo Alto, PA (US); Michael Baus, Bietigheim-Bissingen (DE); Ralf Maier, Gerlingen (DE); Mariusz Koc, Stuttgart (DE)

(72) Inventors: Bongsang Kim, Mountain View, CA (US); Ando Feyh, Reutlingen (DE); Andrew Graham, Redwood City, CA (US); Gary O'Brien, Palo Alto, PA (US); Michael Baus, Bietigheim-Bissingen (DE); Ralf Maier, Gerlingen (DE); Mariusz Koc, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 100 days.

(21) Appl. No.: 15/108,414

(22) PCT Filed: Dec. 30, 2014

(86) PCT No.: PCT/US2014/072694
§ 371 (c)(1),
(2) Date: Jun. 27, 2016

(87) PCT Pub. No.: WO2015/103220
PCT Pub. Date: Jul. 9, 2015

(65) Prior Publication Data
US 2016/0327392 A1 Nov. 10, 2016

Related U.S. Application Data

(60) Provisional application No. 61/921,927, filed on Dec. 30, 2013.

(51) Int. Cl.
*G01P 1/02* (2006.01)
*G01C 19/5769* (2012.01)
(Continued)

(52) U.S. Cl.
CPC ......... *G01C 19/5769* (2013.01); *G01D 5/241* (2013.01); *G01P 1/003* (2013.01);
(Continued)

(58) Field of Classification Search
CPC ... G01C 19/5769; G01P 15/18; G01P 15/125; G01P 15/0802; G01P 1/003; G01P 1/023
See application file for complete search history.

(56) References Cited

U.S. PATENT DOCUMENTS 5,458,000 A * 10/1995 Burns ............... G01D 3/0365
73/497
5,591,679 A * 1/1997 Jakobsen ............ B81C 1/00301
148/DIG. 12

(Continued)

FOREIGN PATENT DOCUMENTS

| EP | 0 72 581 A2 | 11/1996 |
|---|---|---|
| WO | 2013/073162 A1 | 5/2013 |
| WO | 2014085675 A1 | 6/2014 |

OTHER PUBLICATIONS

Supplementary European Search Report corresponding to European Patent Application No. 14 87 6635 (9 pages).
(Continued)

*Primary Examiner* — Helen C Kwok
(74) *Attorney, Agent, or Firm* — Maginot Moore & Beck LLP

(57) ABSTRACT

In one embodiment, a sensor includes a rigid wafer outer body. A first cavity is located within the rigid wafer outer body, and a first vibration isolating spring is supported by the rigid wafer outer body and extends into the first cavity.
(Continued)

A second vibration isolating spring is supported by the rigid wafer outer body and extends into the first cavity, and a first sensor packaging is supported by the first vibration isolating spring and the second vibration isolating spring within the first cavity.

11 Claims, 18 Drawing Sheets

(51) Int. Cl.
  *G01P 15/08* (2006.01)
  *G01D 5/241* (2006.01)
  *G01P 1/00* (2006.01)
  *G01P 15/18* (2013.01)

(52) U.S. Cl.
  CPC .......... *G01P 1/023* (2013.01); *G01P 15/0802* (2013.01); *B81B 2201/0235* (2013.01); *G01P 15/18* (2013.01); *G01P 2015/084* (2013.01); *G01P 2015/0882* (2013.01); *H01L 2224/48137* (2013.01); *H01L 2924/16152* (2013.01)

(56) References Cited

U.S. PATENT DOCUMENTS

| | | | |
|---|---|---|---|
| 7,258,012 B2* | 8/2007 | Xie | B81B 3/0062 73/510 |
| 7,647,832 B2* | 1/2010 | Muchow | B81B 3/0021 73/514.33 |
| 7,793,544 B2* | 9/2010 | Merassi | G01P 15/0891 360/75 |
| 9,096,421 B2* | 8/2015 | Ziglioli | B81C 1/0023 |
| 9,554,471 B2* | 1/2017 | Baillin | H05K 1/183 |
| 9,908,771 B2* | 3/2018 | Feyh | B81B 7/02 |
| 2002/0051258 A1* | 5/2002 | Tamura | B81B 7/0041 358/514 |
| 2002/0113191 A1* | 8/2002 | Rolt | B81B 7/0012 248/550 |
| 2003/0150267 A1* | 8/2003 | Challoner | G01C 19/5656 73/504.02 |
| 2005/0172717 A1* | 8/2005 | Wu | B60C 23/0408 73/514.34 |
| 2006/0042059 A1* | 3/2006 | Satoh | F04B 37/14 29/25.01 |
| 2006/0237806 A1 | 10/2006 | Martin et al. | |
| 2006/0272413 A1 | 12/2006 | Vaganov et al. | |
| 2007/0277607 A1* | 12/2007 | Ino | G01P 1/023 73/514.16 |
| 2008/0275661 A1* | 11/2008 | Yang | G03F 7/70725 702/105 |
| 2008/0282802 A1* | 11/2008 | Pike | G01P 15/08 73/514.32 |
| 2009/0084182 A1* | 4/2009 | Muchow | G01L 9/0054 73/514.34 |
| 2009/0085191 A1* | 4/2009 | Najafi | B81B 7/0058 257/698 |
| 2009/0282915 A1* | 11/2009 | Ohta | B81B 7/0058 73/504.12 |
| 2010/0025845 A1* | 2/2010 | Merz | B81B 7/0038 257/723 |
| 2010/0059911 A1* | 3/2010 | Goepfert | F16F 15/0232 267/140.11 |
| 2010/0077860 A1* | 4/2010 | Grossman | G01C 21/16 73/514.31 |
| 2010/0242603 A1* | 9/2010 | Miller | B81B 7/02 73/514.32 |
| 2010/0300201 A1* | 12/2010 | Ge | B81B 7/0048 73/504.12 |
| 2011/0016972 A1* | 1/2011 | Reinert | G01C 19/5783 73/504.12 |
| 2011/0048129 A1* | 3/2011 | Yamanaka | B81B 7/02 73/504.12 |
| 2011/0056296 A1* | 3/2011 | Kanemoto | B81B 3/0086 73/514.32 |
| 2011/0120221 A1* | 5/2011 | Yoda | B81B 3/0086 73/514.32 |
| 2011/0296916 A1* | 12/2011 | Ge | G01P 15/125 73/514.32 |
| 2012/0045723 A1* | 2/2012 | Nawata | F16F 15/002 430/325 |
| 2013/0104656 A1* | 5/2013 | Smith | G01P 15/125 73/514.32 |
| 2013/0105921 A1* | 5/2013 | Najafi | G01P 15/0802 257/415 |
| 2013/0194770 A1* | 8/2013 | Bernstein | B81B 7/0016 361/808 |
| 2013/0265701 A1* | 10/2013 | Takizawa | H05K 5/069 361/679.01 |
| 2013/0328253 A1* | 12/2013 | Kraner | G05B 19/404 267/140.14 |
| 2014/0007685 A1* | 1/2014 | Zhang | G01P 15/125 73/514.32 |
| 2014/0150552 A1* | 6/2014 | Feyh | G01C 19/5755 73/504.12 |
| 2015/0136937 A1* | 5/2015 | Xu | F16F 15/022 248/566 |

OTHER PUBLICATIONS

International Search Report corresponding to PCT Application No. PCT/US2014/072694, dated Apr. 20, 2015 (4 pages).

* cited by examiner

ROBUST INERTIAL SENSORS

This application is a 35 U.S.C. § 371 National Stage Application of PCT/US2014/072694, filed on Dec. 30, 2014, which claims the benefit of priority to U.S. Provisional Application No. 61/921,927, which was filed on Dec. 30, 2013, the entire contents of both applications are hereby incorporated by reference herein.

FIELD

This disclosure relates generally to wafers and substrates such as those used for micromechanical electrical system (MEMS) devices or semiconductor devices. Particularly, it relates to robust inertial MEMS sensors and the manufacture thereof.

BACKGROUND

MEMS based sensors, particularly inertial sensors such as gyroscopes, can be highly sensitive to external vibrations because there is often some mechanical coupling of the external vibrations to the sensing structure of the MEMS based sensor. This coupling affects the ability of the sensor to provide accurate measurements and will often lead to incorrect sensor output. This problem is particularly critical for MEMS based sensors that are being used for automotive or power tool applications.

Typically the problem of external vibrations is solved by mounting the MEMS based sensors using external damping elements. The incorporation of an external damping element, however, significantly increases the cost of a device. In many cases, the cost of the damping elements themselves and the cost of mounting the damping elements to a sensor exceed the cost of the sensor systems themselves.

What is needed therefore is a MEMS based sensor design that does not require the use of expensive damping and mounting systems. A sensor design which incorporates known MEMS manufacturing processes while reducing the effect of external vibrations on a sensor would be further beneficial.

SUMMARY

To help resolve the problem of external vibrations, a sensor is fabricated with a wafer-level encapsulation approach. The sensor element, for example, a MEMS gyroscope, is fabricated upon a wafer-level sensor platform, a wafer such as a silicon or silicon on oxide (SOI) wafer that is suspended by micro-machined spring supports from a preferably rigid outer portion of the sensor package. In this way, the sensor can be vibrationally decoupled from the rigid outer portion. Consequently, the sensor package may be anchored directly to a mounting surface, such as a printed circuit board (PCB) substrate, instead of using further decoupling structures, resulting in substantial costs savings.

In some embodiments, a spring supported sensor platform is suspended in a high atmospheric/ambient pressure which provides damping of the spring supported sensor. The combination of damping and vibration decoupling between the sensor and the outer housing provides an effective isolation of the sensor from the rigid outer portion at frequencies such as the relatively high frequencies associated with vibration. In other embodiments, the sensor is encased within a gel material. Gel materials are used for even higher damping than can be provided by high atmospheric/ambient pressure.

The electrical connections from the sensor to the rigid outer portion can be realized on or within the spring supports. The sensor element itself can be encapsulated at any arbitrary pressure, including extremely low pressure.

In one embodiment, a sensor includes a rigid wafer outer body, a first cavity located within the rigid wafer outer body, a first spring supported by the rigid wafer outer body and extending into the first cavity, a second spring supported by the rigid wafer outer body and extending into the first cavity, and a first sensor structure supported by the first spring and the second spring within the first cavity.

In one or more embodiment, the first sensor structure includes an encapsulated sensor element located within a second cavity.

In one or more embodiment, the first cavity has a first pressure, the second cavity has a second pressure, and the first pressure is a different pressure from the second pressure.

In one or more embodiment, a sensor assembly includes a second sensor structure directly supported by the rigid wafer outer body.

In one or more embodiment, a sensor assembly includes a second sensor structure supported by the first spring and the second spring within the first cavity.

In one or more embodiment, the first spring has a first spring constant, the second spring has a second spring constant, and the first spring constant is different from the second spring constant.

In one or more embodiment, a sensor assembly includes at least one anchor, and at least one third spring extending from the at least one anchor and supporting the rigid wafer outer body, the at least one third spring integrally formed with the at least one anchor and the rigid wafer outer body.

In one or more embodiment, the rigid wafer outer body includes a first portion of a silicon dioxide layer, and a second portion of the silicon dioxide layer is located at a bottom portion of the first sensor structure.

In one or more embodiment, a sensor assembly includes at least one interconnect extending from the first sensor structure into the rigid wafer outer body and supported by the first spring.

In one or more embodiment, the at least one interconnect is embedded within the first spring.

In one or more embodiment, a method of forming a sensor includes forming a first sensing structure, forming a first spring, the first spring including a first portion forming a portion of a rigid outer body, and a second portion extending from the rigid outer body to the first sensing structure, forming a second spring, the second spring including a third portion forming a portion of the rigid outer body, and a fourth portion extending from the rigid outer body to the first sensing structure, and forming a cavity about the first sensing structure such that the first sensing structure is supported in the first cavity by the first spring and the second spring.

In one or more embodiment, forming the first sensor structure includes releasing a sensor element within the first sensing structure, and encapsulating the released sensor element.

In one or more embodiment, a method includes establishing a first final pressure of the sensor assembly within the first cavity, and establishing a second final pressure of the sensor assembly within the second cavity, wherein the first final pressure is a pressure different from the second final pressure.

In one or more embodiment, a method includes supporting a second sensor structure with the rigid outer body.

In one or more embodiment, supporting the second sensor structure with the rigid outer body includes supporting the second sensor structure directly with the rigid outer body.

In one or more embodiment, supporting the second sensor structure with the rigid outer body includes supporting the second sensor structure with the rigid outer body through the first and second springs.

In one or more embodiment, forming the first spring comprises forming the first spring with a first thickness, forming the second spring comprises forming the second spring with a second thickness, and the first thickness is thicker than the second thickness, such that the first spring and the second spring have different spring constants.

In one or more embodiment, a method includes forming at least one anchor, and forming at least one third spring extending from the at least one anchor and supporting the rigid outer body, the at least one third spring integrally formed with the at least one anchor and the rigid outer body.

In one or more embodiment, a method includes forming at least one interconnect extending from the first sensor structure into the rigid wafer outer body and supported by the first spring.

In one or more embodiment, forming the first spring includes embedding the at least one interconnect within the first spring.

DESCRIPTION

Figure 1:
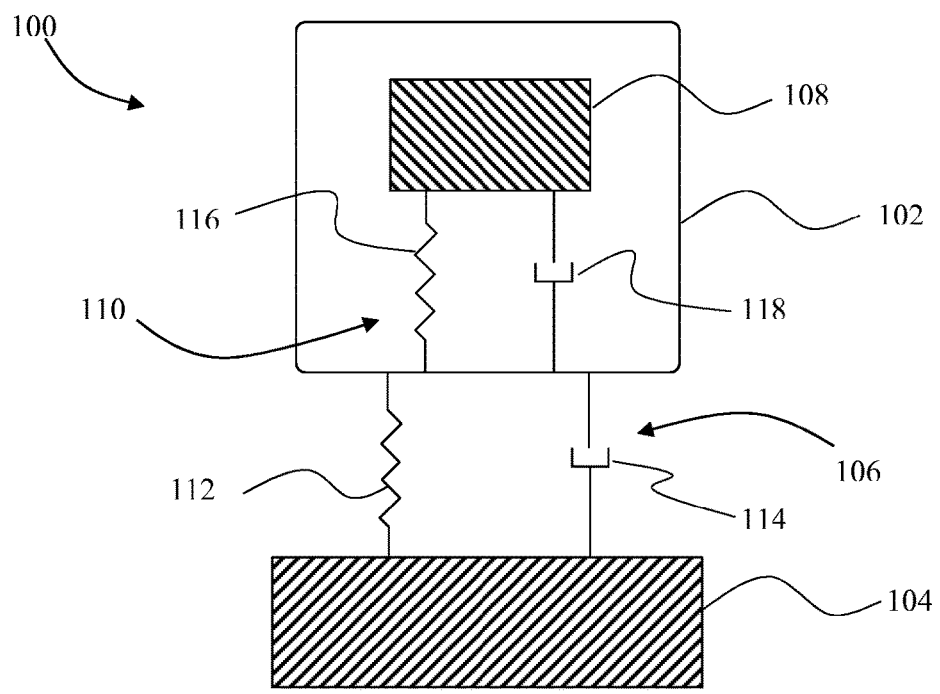
FIG. 1 depicts a system model of a MEMS sensor exhibiting vibrational decoupling of a sensing structure and a sensor from a rigid outer portion.

For the purposes of promoting an understanding of the principles of the disclosure, reference will now be made to the embodiments illustrated in the drawings and described in the following written specification. It is understood that no limitation to the scope of the disclosure is thereby intended. It is further understood that the present disclosure includes any alterations and modifications to the illustrated embodiments and includes further applications of the principles of the disclosure as would normally occur to one skilled in the art which this disclosure pertains.

FIG. 1 depicts a system model 100 which provides vibrational decoupling of a sensing structure and a wafer-level sensor platform from a rigid outer portion of the packaging. The model 100 includes a sensor packaging 102 which is vibrationally isolated from a sensor substrate 104 by a vibration isolating assembly 106. A sensor element 108 is suspended within the sensor packaging 102 by a suspension assembly 110. The vibration isolating assembly 106 includes a spring element 112 and a damping element 114. Similarly, the suspension assembly 110 includes a spring element 116 and a damping element 118.

Figure 2:
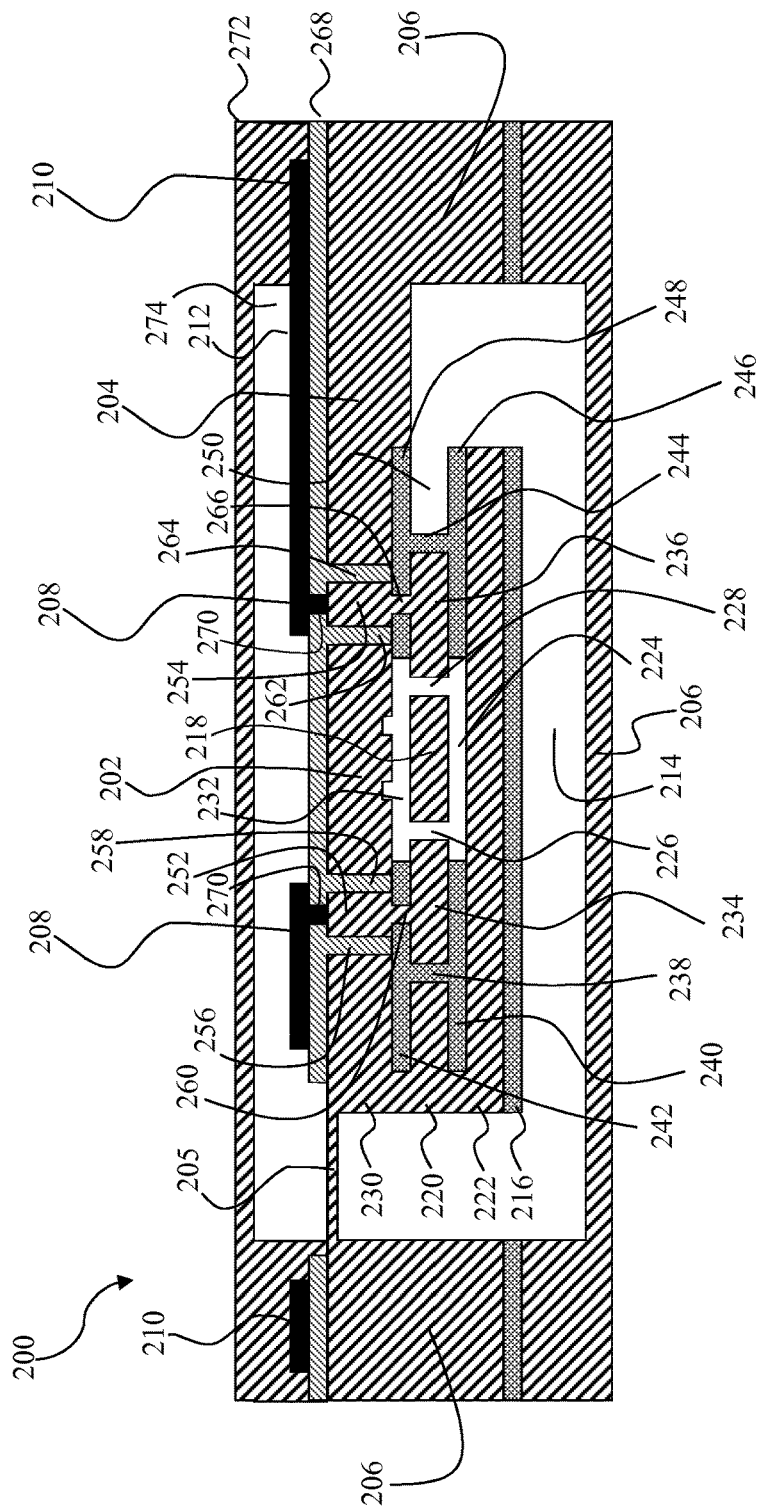
FIG. 2 depicts a side cross-sectional view of a sensor assembly incorporating a sensor that is suspended from a rigid outer portion by a vibration isolating assembly incorporating spring members that decouple the sensor platform from external vibrations.

FIG. 2 depicts an inertial sensor assembly 200 including a sensor 202 that is suspended by spring supports 204 and 205 from a rigid outer portion 206 of the wafer. The spring support 204 is substantially thicker than the spring support 205. Bond pads 208 on the sensor are electrically coupled with bond pads 210 on the rigid outer portion 206, by interconnects 212. A cavity 214 is defined between the inner surface of the rigid outer portion 206, a lower surface of the sensor 202, and the lower surface of the spring supports 204 and 205. A portion of a silicon dioxide layer 216 defines the base of the sensor 202. Portions of the silicon dioxide layer 216 are also present in the rigid outer portion 206.

Within the sensor, a sensing structure 218 is defined within a middle device layer 220. The sensing structure 218 is electrically and mechanically isolated from a lower device layer 222 by an etched portion 224 below the sensing structure 218. The lower device layer 222 is directly above the silicon dioxide layer 216, at the base of the sensor 202. The sensing structure 218 is separated from some portions of the middle device layer 220 by etched portions 226 and 228, on each side of the sensing structure 218. The sensing structure 218 is electrically and mechanically isolated from an upper device layer 230 by etched portion 232 above the sensing structure 218.

On each side of the sensing structure 218 are sensor electrodes 234 and 236. The sensor electrode 234 is defined within the middle device layer 220 between a silicon dioxide spacer 238 and the etched portion 226. The sensor electrode 234 is electrically isolated from the lower device layer 222 by a lower silicon dioxide portion 240 and from the upper device layer by an upper silicon dioxide portion 242. Similarly, the sensor electrode 236 is defined within the middle device layer 220 between a silicon dioxide spacer 244 and the etched portion 228. The sensor electrode 236 is electrically isolated from the lower device layer 222 by a lower silicon dioxide portion 246 and from the upper device layer 230 by an upper silicon dioxide portion 248. An etch portion 250 is further defined between the silicon dioxide spacer 244 and the lower and upper silicon dioxide portions, 246 and 248, and is in communication with the cavity 214.

Directly above the sensor electrodes 234 and 236 are connector portions 252 and 254. The connector portion 252 is defined within the upper device layer 230 between nitride spacers 256 and 258 that electrically isolate it from the rest of the upper device layer 230. The connector portion 252 is in electrical communication with the sensor electrode 234 via a contact portion 260 through the upper silicon dioxide portion 242. Similarly, the connector portion 254 is defined within the upper device layer 230 between nitride spacers 262 and 264 that electrically isolate it from the rest of the upper device layer 230. The connector portion 254 is in electrical communication with the sensor electrode 236 via a contact portion 266 through the upper silicon dioxide portion 246.

A nitride passivation layer 268 is on the upper surface of the rigid outer portion 206, the upper surface of the spring support 204, and the upper surface of the upper device layer 230, but does not extend onto the upper surface of the spring support 205. The bond pads 208 are on the upper surface of the nitride passivation layer 268, directly above each of the connector portions 252 and 254. The bond pads 208 are each in electrical communication with the connector portions 252 and 254, via metal contact portions 270 that extend through the nitride passivation layer 268. The bond pads 210 are on the upper surface of the nitride passivation layer 268, above the rigid outer portion 206. The bond pads 610 are in electrical communication with the bond pads 208 via the interconnects 212, which extend along the upper surface of the nitride passivation layer passing over the spring support 204. In one embodiment, one or more of the interconnects 212 are buried within one or more of the springs 204/205. A cap 272 is positioned in the bond pad 210 and defines an upper cavity 274.

The sensing structure 218 is suspended within the etched portions 232, 224, 226, and 228 by a portion (not shown) of the middle device portion 220 in any desired manner including those well known in the art. The supporting portion of the middle device layer 220 and the atmosphere in the etched portions 232, 224, 226, and 228 thus function as the suspension assembly 110 for the inertial sensor assembly 200. By modifying the cross-section and length of the supporting portion of the middle device portion 220 and the atmosphere within the etched portions 232, 224, 226, and 228, the inertial sensor assembly 200 is tuned for a desired movement response.

The spring supports 204 and 205 and the atmospheres within the cavities 214 and 274 operate as a vibration isolating assembly like the vibration isolating assembly 106. By modifying the cross section of the spring supports 204 and 205 and the atmosphere/surroundings within the cavities 214 and 274, the inertial sensor assembly 200 is tuned to reduce or eliminate the effect of vibrations which are not desired to be sensed.

Figure 3:
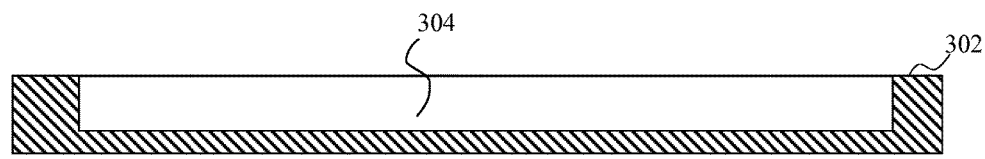
FIGS. 3-38 depict a process for fabricating a sensor assembly like the sensor assembly of FIG. 2 incorporating a sensor that is suspended from a rigid outer portion by a vibration isolating assembly incorporating spring members that decouple the sensor platform from external vibrations.
Figure 4:

A process for forming a sensor such as the inertial sensor 200 is discussed with reference to FIGS. 3-38. Referring initially to FIG. 3, a silicon substrate layer 302 is initially etched to define an etched portion 304. The etched portion 304 is widely and deeply etched to define the width and depth of a cavity which will be discussed more fully bellow. Referring to FIG. 4, the etched portion 304 is then filled with an oxide to form a lower oxide portion 306.

Figure 5:
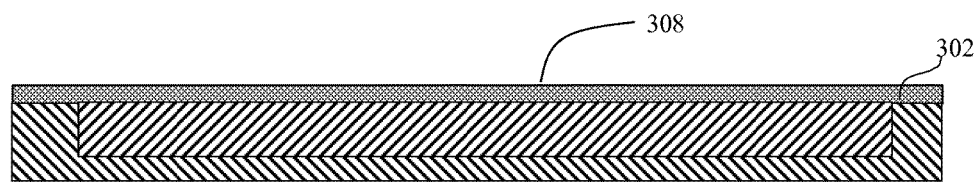
Figure 6:
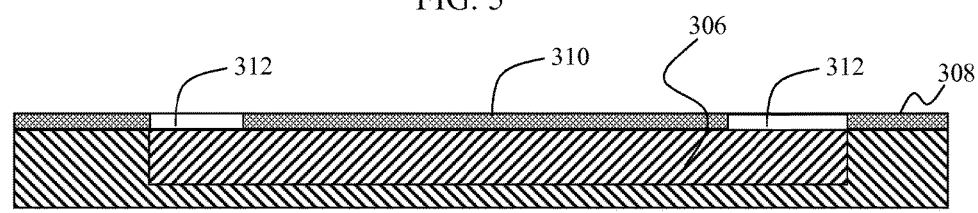

Referring to FIG. 5, a silicon dioxide layer 308 is formed on the upper surface of the substrate layer 302 and the upper surface of the lower oxide portion 306. The silicon dioxide layer 308 is patterned and etched resulting in the configuration of FIG. 6. A remainder 310 of the silicon dioxide layer 308 forms the base of a sensor that is positioned above the lower oxide portion 306. A trench 312 surrounds the remainder 310, defining its perimeter, and revealing the upper surface of the lower oxide portion 306.

Figure 7:
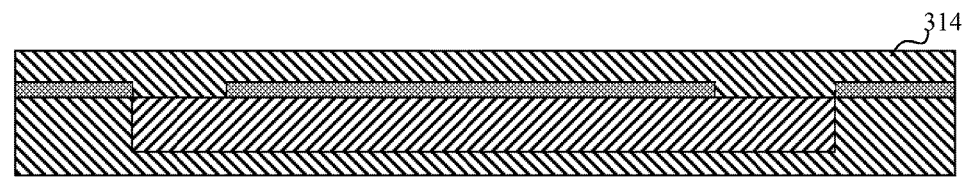
Figure 8:
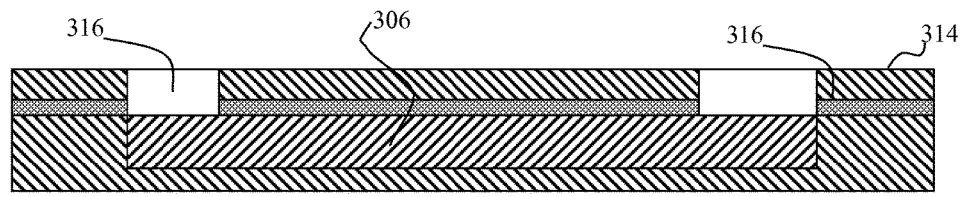
Figure 9:
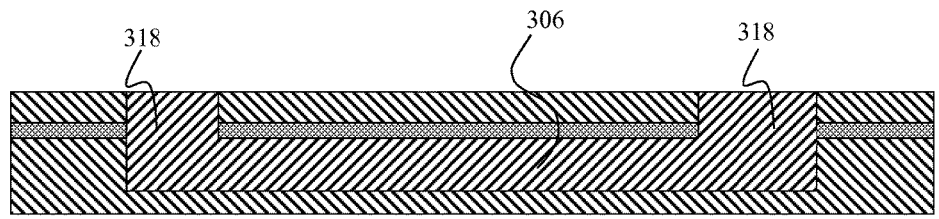

Referring to FIG. 7, a silicon layer 314 is then formed on the upper surface of the silicon dioxide layer 308 to form a lower device layer while also filling the trench 312. A trench 316 is etched into the lower device layer 314 (FIG. 8). The trench 316 extends from the upper surface of the lower device layer 314 to the upper surface of the lower oxide portion 306 and is coextensive with the previously filled trench 312. As shown in FIG. 9, the trench 316 is then filled with oxide to form a lower middle oxide portion 318 above the perimeter of the lower oxide portion 306.

Figure 10:
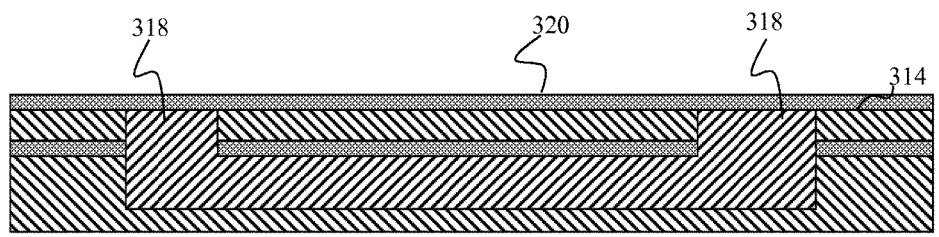
Figure 11:
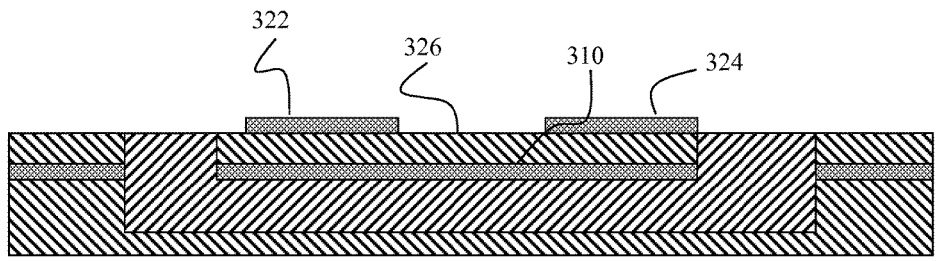

A silicon dioxide layer 320 is then formed on the upper surface of the lower device layer 314 and the lower middle oxide portion 318 (FIG. 10). The silicon dioxide layer 320 is then patterned and etched resulting in the configuration of FIG. 11. In FIG. 11, a remainder 322 of the silicon dioxide layer 320 forms a lower silicon dioxide portion toward the left side of the sensor 310, and a remainder 324 of the silicon dioxide layer 320 forms a lower silicon dioxide portion on the right side of the sensor 310. An etched portion 326 is defined between the lower silicon dioxide portions 322 and 324.

Figure 12:
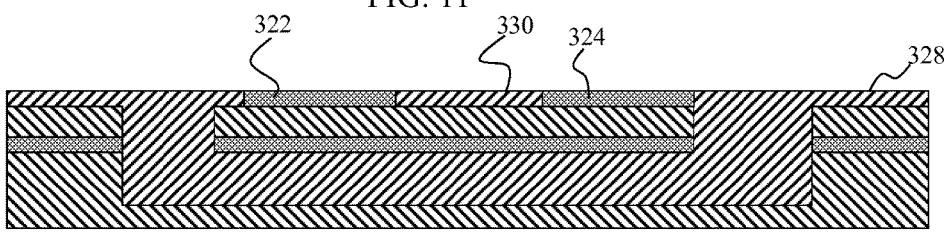
Figure 13:
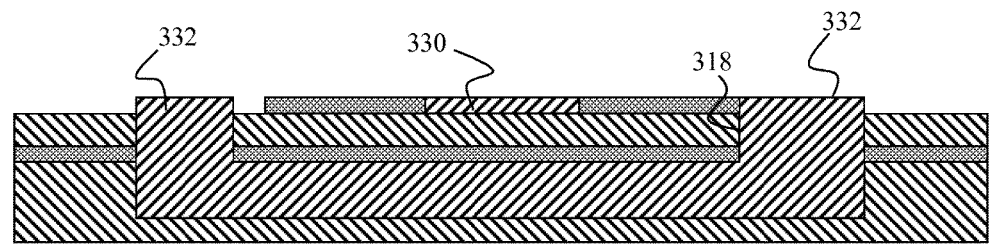

An oxide layer 328 is then formed to fill the etched away portions of the silicon dioxide layer 320 (FIG. 12). As shown in FIG. 13, the oxide layer 328 is etched away leaving the etched portion 326 filled with oxide to form a bottom oxide portion 330, and an oxide portion 332 directly above and coextensive with the lower middle oxide portion 318. The bottom oxide portion 330 will later define the lower edge of a sensing structure described more fully below.

Figure 14:
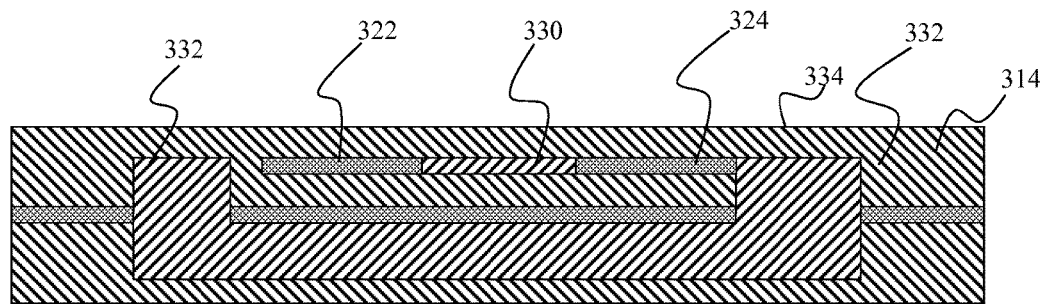
Figure 15:
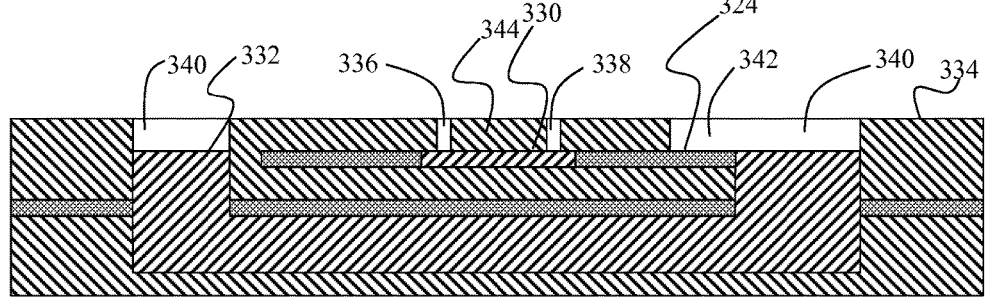
Figure 16:
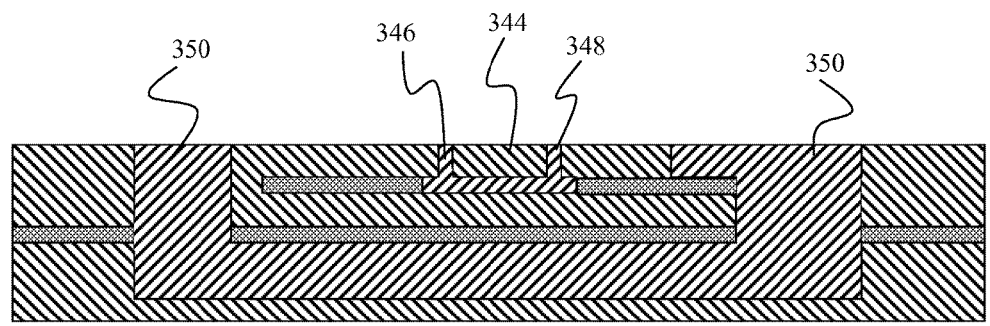

Continuing at FIG. 14, a silicon layer 334 is then formed on the upper surface of the lower insulating portions 322 and 324, the bottom oxide portion 330, the oxide portion 332, and the lower device layer 314 to form a middle device layer. In FIG. 15, trench portions 336, 338, 340, and 342 are then etched into middle device layer 334. The trenches 336 and 338 extend from the upper surface of the middle device layer 334 to the upper surface of the bottom oxide portion 330 and define between them a sensing structure 344. The trench portion 340 extends from the upper surface of the middle device layer 334 to the upper surface of the oxide portion 332 and is directly above and coextensive with the oxide portion 332. The trench portion 342 extends from the upper surface of the middle device layer to the upper surface of the lower insulating portion 324, revealing it partially, and is in communication with the trench 340. The trenches 336, 338, 340, and 342 are then filled with oxide as depicted in FIG. 16. The trenches 336 and 338 are filled to form side oxide portions 346 and 348, which define between them the sensing structure 344. The trenches 340 and 342 are filled to form a middle oxide portion 350.

Figure 17:
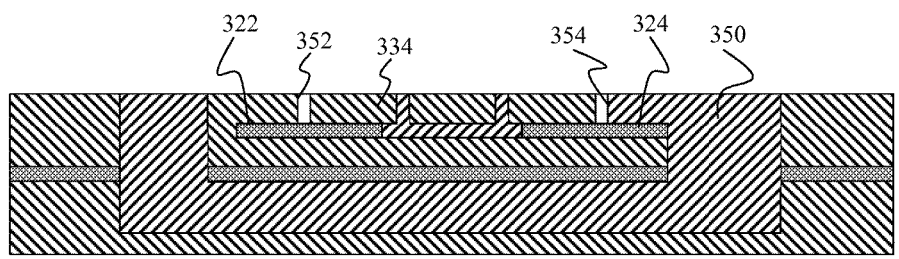
Figure 18:
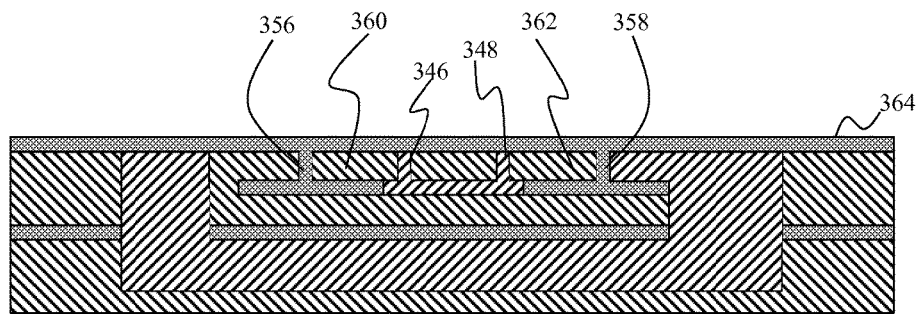

Referring to FIG. 17, trenches 352 and 354 are then etched into the middle device layer 334. The trench 352 extends from the upper surface of the middle device layer 334 to the upper surface of the lower silicon dioxide portion 322. The trench 354 extends from the upper surface of the middle device layer 334 to the upper surface of the lower silicon dioxide portion 324 and is adjacent the middle oxide portion 350. The trenches 352 and 354 are then filled with silicon dioxide to form silicon dioxide spacers 356 and 358 (FIG. 18). The silicon dioxide spacer 356 and the side oxide portion 346 now define between them a sensor electrode 360. The silicon dioxide spacer 358 and the side oxide portion 348 now define between them a sensor electrode 362. A silicon dioxide layer 364 is further formed on the upper surface of the middle device layer 334, the middle oxide portion 350, the silicon dioxide spacers 356 and 358, and the side oxide portions 346 and 348.

Figure 19:
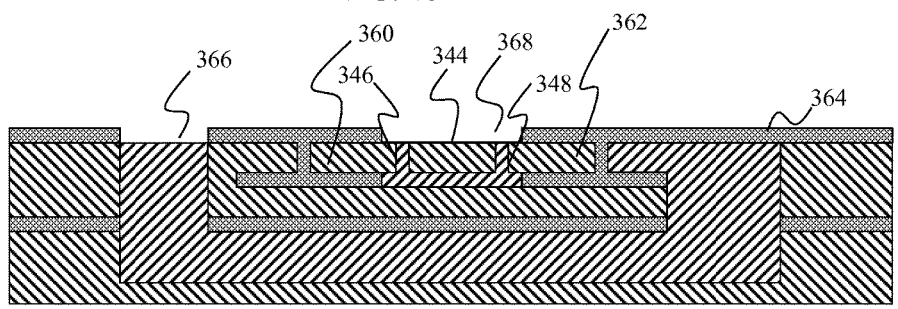
Figure 20:
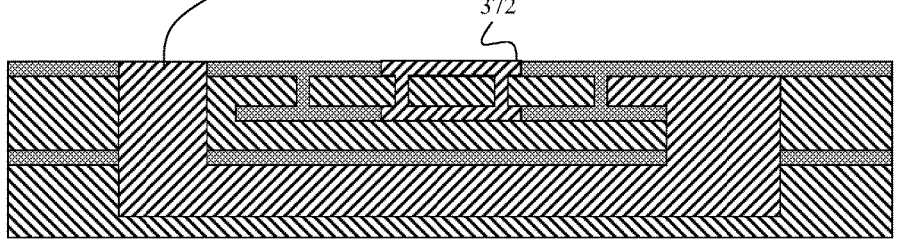

Trenches 366 and 368 are then etched into the silicon dioxide layer 364 (FIG. 19). The trench 366 extends from the upper surface of the hard mask layer 364 to the upper surface of the middle oxide portion 350. The trench 368 extends from the upper surface of the silicon dioxide layer 364 to the upper surface of the sensing structure 344, and the side oxide portions 346 and 348. The trench 368 partially reveals the sensor electrodes 360 and 362. The trench 366 is then filled with oxide (FIG. 20) to form an oxide portion 370 and the trench 368 is filled with oxide to form a top oxide portion 372.

Figure 21:
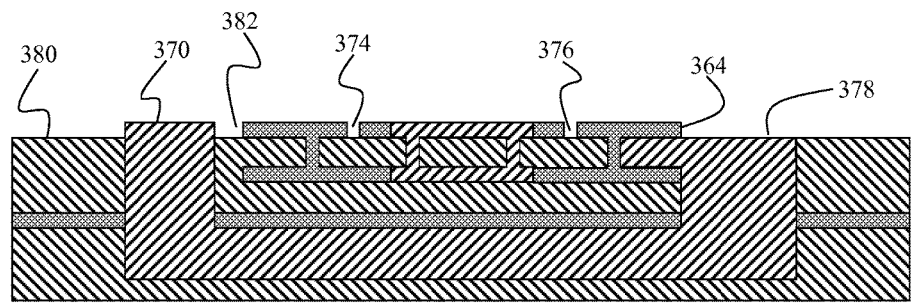
Figure 22:
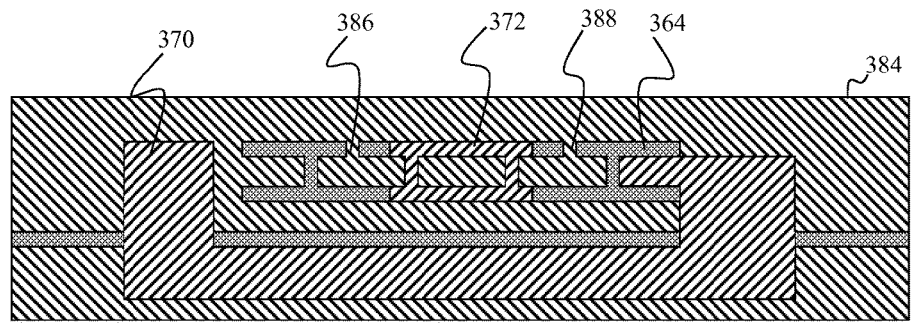

Referring to FIG. 21, contact opening 374 and 376, and etched portions 378, 380, and 382 are then etched into the silicon dioxide layer 364. The contact openings 374 and 376 extend through the silicon dioxide layer 364 to expose the sensor electrodes 360 and 362, respectively. The etched portion 378 extends from the upper surface of the silicon dioxide layer 364 to the upper surface of the middle oxide portion 350 and the middle device layer 334. The etched portions 380 and 382 extend from the upper surface of the silicon dioxide layer 364 to the upper surface of the middle device layer on each side of the oxide portion 370. The contact openings 374 and 376, and the etched portions 378, 380, and 382 are then filled with silicon and a silicon layer 384 is further formed on the upper surface of the oxide portion 370, the silicon dioxide layer 364, and the top oxide portion 372 to form an upper device layer (FIG. 22). The contact openings 374 and 376 are filled to form contact portions 386 and 388.

Figure 23:
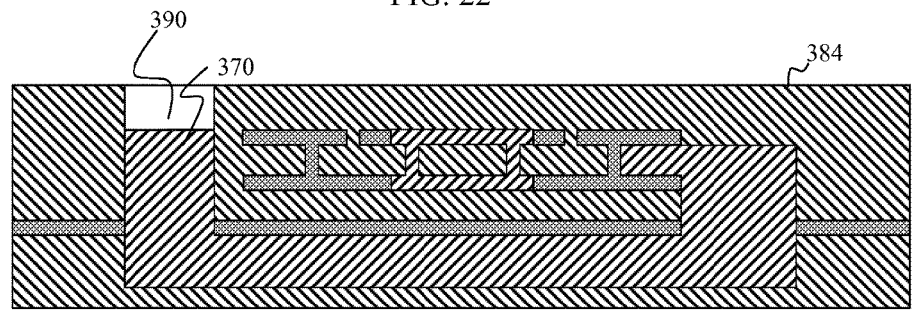
Figure 24:
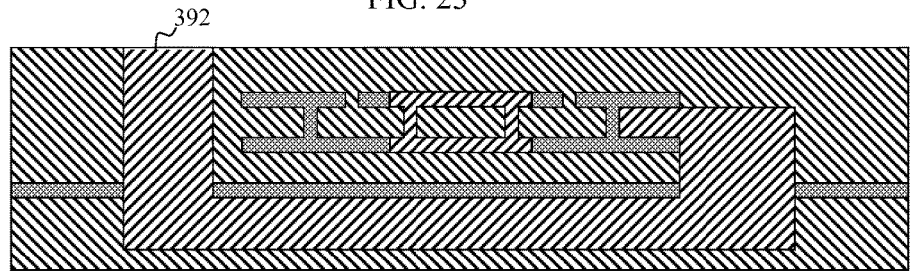
Figure 25:
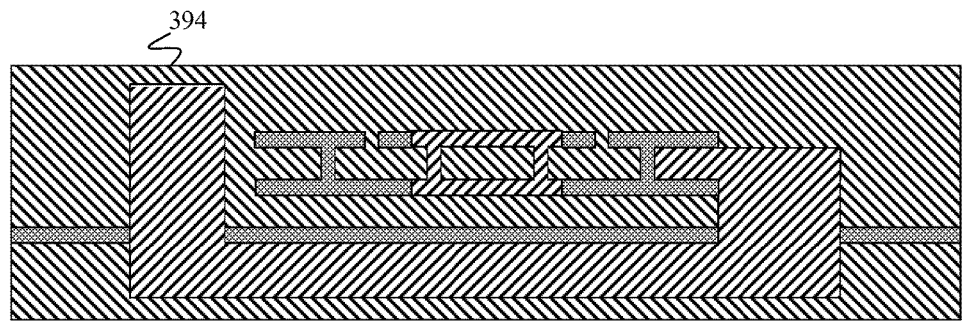
Figure 26:
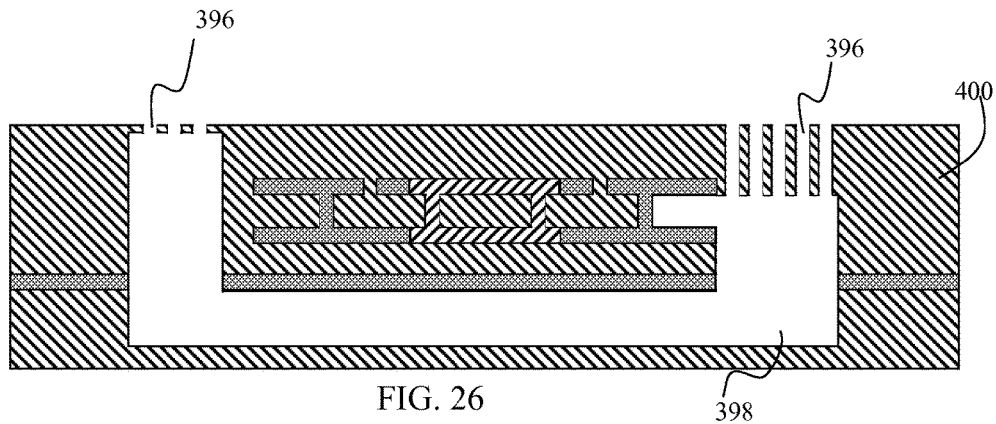

A trench 390 is etched into the upper device layer 384 (FIG. 23). The trench 390 extends from the upper surface of the upper device layer 384 to the upper surface of the oxide portion 370 and is directly above and coextensive with the oxide portion 370. Referring to FIG. 24, the trench 390 is then filled with oxide to form an upper middle oxide portion 392. A thin silicon layer 394 is then formed on the upper surface of the upper device layer 384 and the upper middle oxide portion 392 to form a top device layer (FIG. 25).

Figure 27:
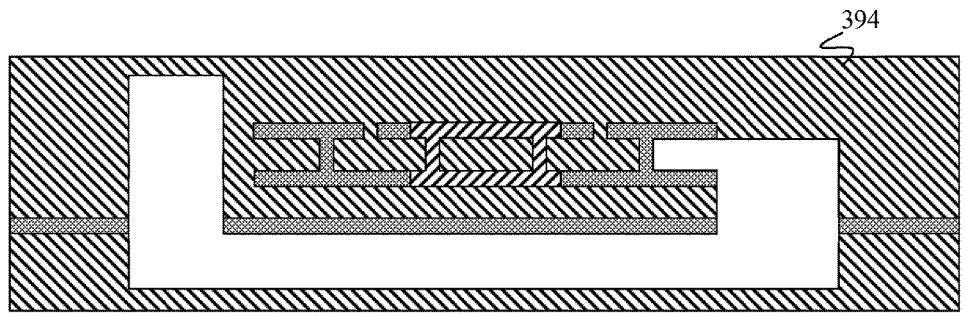

After vent holes 396 are formed (FIG. 26), an HF vapor etch release is performed which forms a cavity 398. The cavity 398 is defined by the space previously occupied by the upper middle oxide portion 392, oxide portion 370, the middle oxide portion 350, the oxide portion 332, the lower middle oxide portion 318, and the lower oxide portion 306. This step thus sets the gaps between the sensor and the rigid outer portion 400. A clean high temperature seal is then performed in an epi-reactor to seal the vent holes 396 (FIG. 27). Alternatively, the vent holes may be sealed using oxide, nitride, silicon migration, etc.

Figure 28:
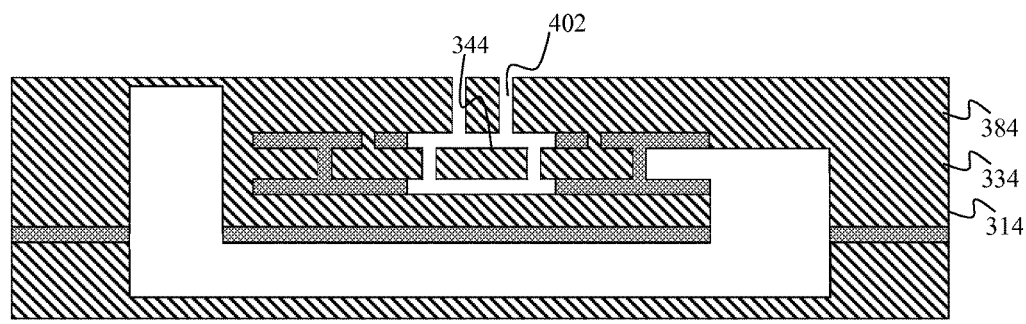
Figure 29:
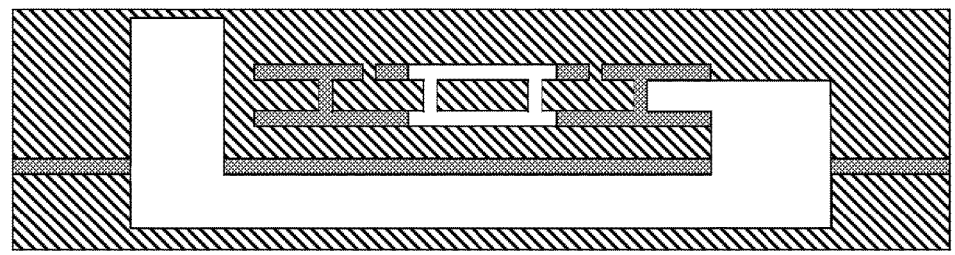

Vent holes 402 are then formed and an HF vapor etch release is performed which releases the sensing structure 344 from the upper and lower device layers, 384 and 314, and from the rest of the middle device layer 334 (FIG. 28). The vent holes 402 are then sealed resulting in the configuration of FIG. 29.

Figure 30:
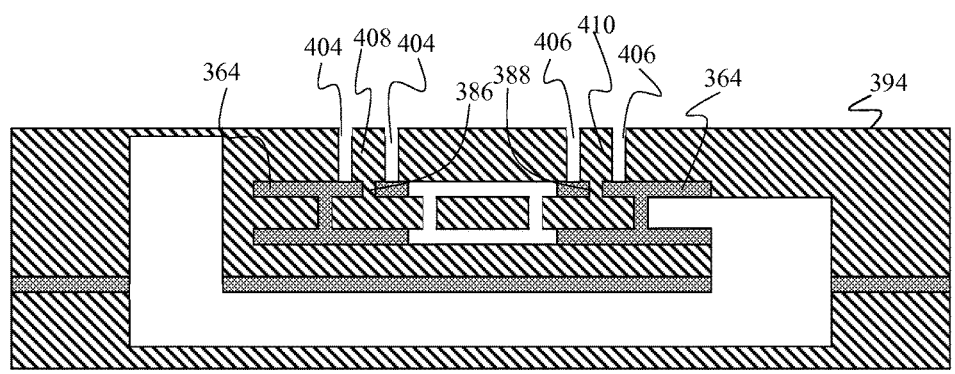
Figure 31:
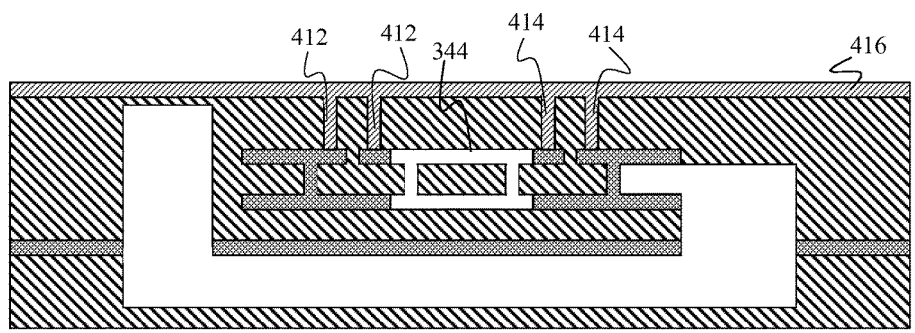

Trenches 404 and 406 are etched into the top and upper device layers, 394 and 384 (FIG. 30). The trench 404 extends from the upper surface of the top device layer 394 to the upper surface of the silicon dioxide layer 364, defining a connector portion 408 directly above the contact portion 386. The trench 406 extends from the upper surface of the top device layer 394 to the upper surface of the silicon dioxide layer 364, defining a connector portion 410 directly above the contact portion 388. The connector portion 408 is in electrical communication with the sensor electrode 360 via the contact portion 386. The connector portion 410 is in electrical communication with the sensor electrode 362 via the contact portion 388. The trenches 404 and 406 are filled with nitride to form nitride spacers 412 and 414, respectively (FIG. 31). A nitride passivation layer 416 is further formed on the upper surface of the top device layer 394.

Figure 32:
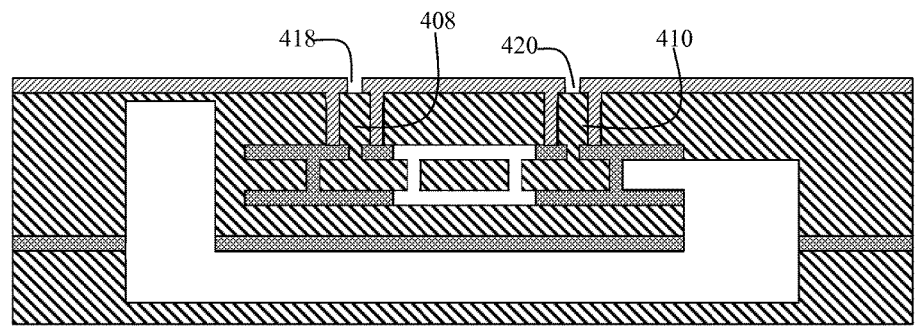
Figure 33:
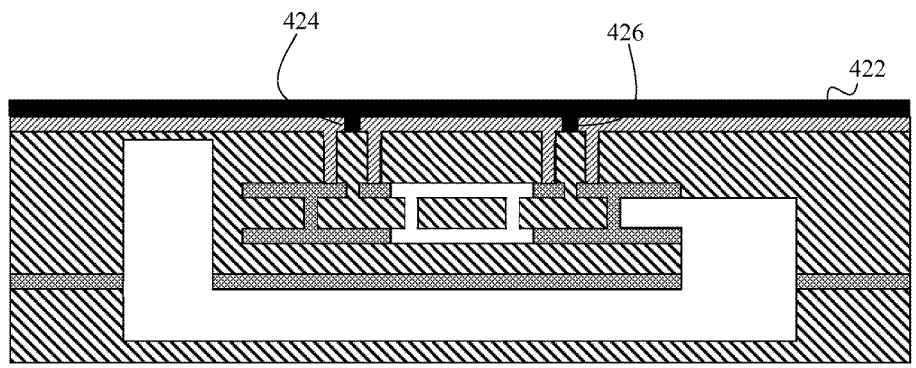

Contact openings 418 and 420 are etched into the nitride passivation layer 416 (FIG. 32). The contact opening 418 extends through the nitride passivation layer and exposes the upper surface of the connector portion 408. Similarly, the contact opening 420 extends through the nitride passivation layer 416 and exposes the upper surface of the connector portion 410.

Figure 34:
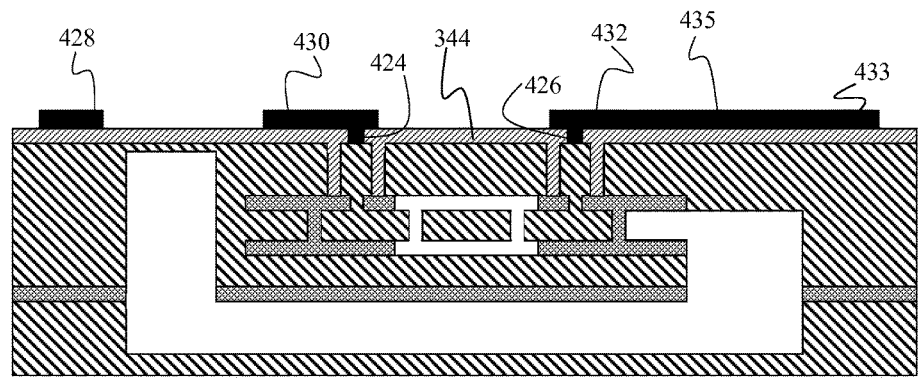

A metal layer 422 is formed on the upper surface of the nitride passivation layer 416 (FIG. 33), also filling the contact openings 418 and 420 with metal contact portions 424 and 426, respectively. The metal layer 422 is patterned and etched resulting in the configuration of FIG. 34. In FIG. 34, a remainder of the metal layer forms bond pads 428, 430, 432, and 433. The bond pads 430 and 432 are above the metal contact portions 424 and 426. Additionally, a metal interconnect 435 connects the bond pad 432 to the bond pad 433.

Finally, the nitride passivation layer 416 is etched to form an etched portion 434, directly above the area where the upper oxide portion 392 was before it was released to form part of the cavity 398. The etched portion 434 extends from the upper surface of the nitride passivation layer 416 to the upper surface of the top device layer 394. The top device layer 394 below the etched portion 434 forms a spring member.

Figure 35:
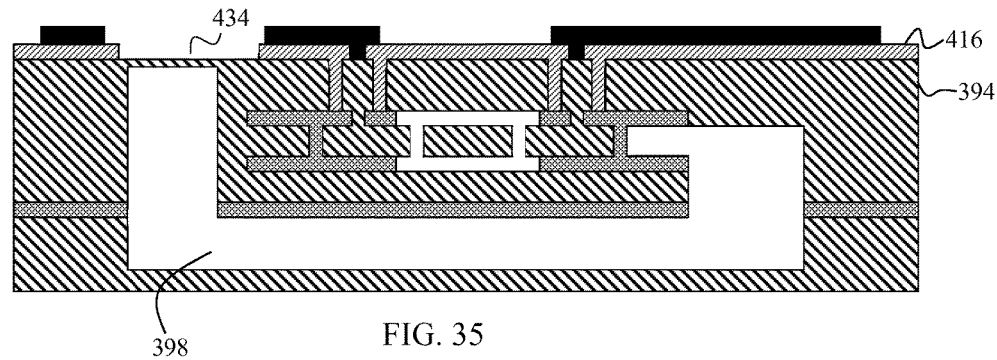

While in some embodiments the process is terminated with the configuration of FIG. 35, in some embodiments a cap is separately formed and then affixed to the bond pads 428 and 433.

Figure 36:
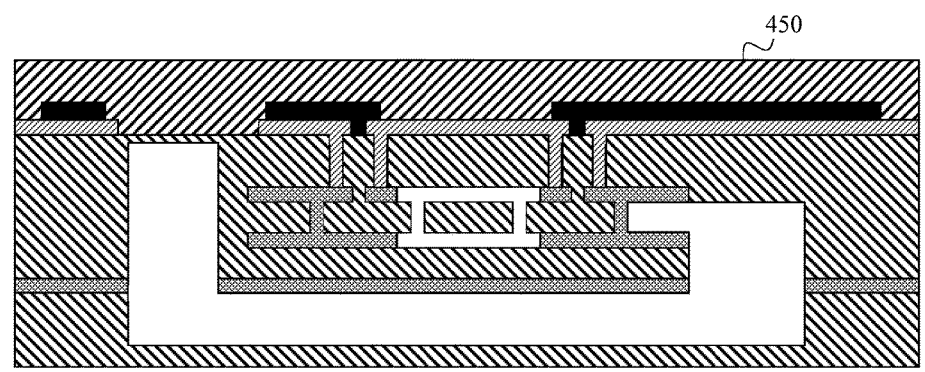
Figure 37:
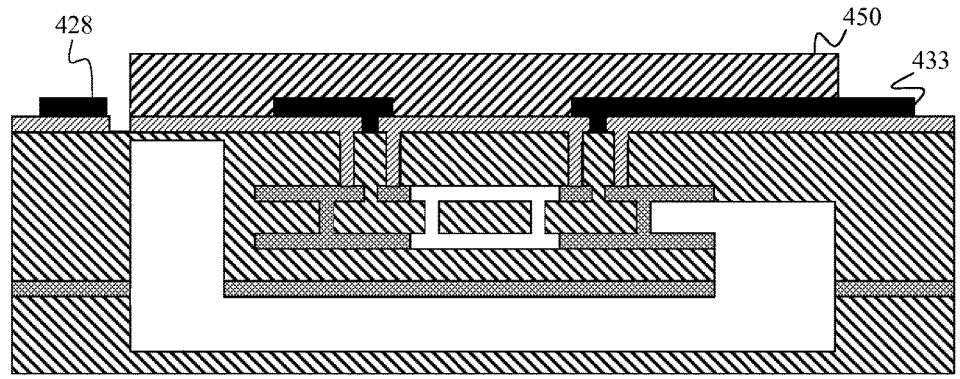
Figure 38:
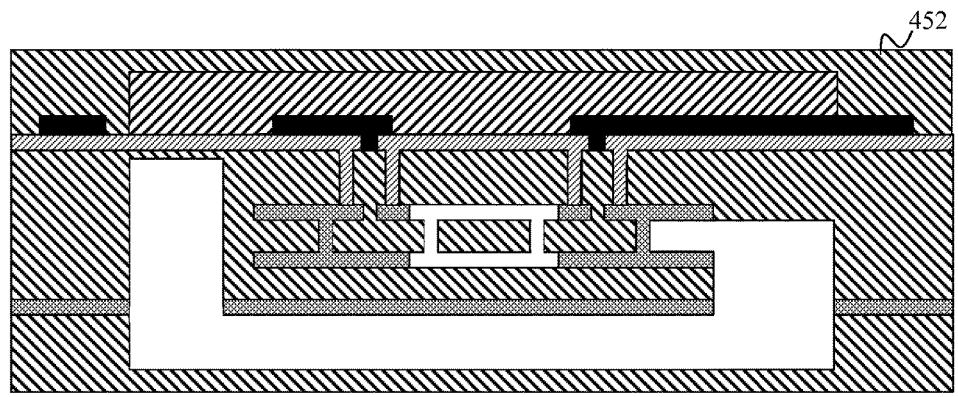

In other embodiments, a cap is formed on the device of FIG. 35. In one such embodiment, formation of a device such as the inertial sensor assembly 200 continues with the deposition of an oxide layer 450 on the upper surface of the bond pads 428, 430, 432, and 433, the interconnect 435, the nitride passivation layer 416, and the top device layer 394 (FIG. 36). Potions of oxide layer 450 are then etched to reveal the bond pads 428 and 433 (FIG. 37). A silicon cap layer 452 is formed on the oxide layer 450 (FIG. 38), followed by etching of the oxide 450 resulting in the configuration of FIG. 2. In some embodiments, the oxide layer 450 of FIG. 36 is deposited partially directly on top of the oxide portion 318. The oxide portion 318 is then etched along with the oxide layer 450.

Moreover, while the above description included the formation of vent holes 396 and etching of the oxide 318 prior to deposition of the oxide layer 450, in some embodiments vent holes are not needed.

Figure 39:
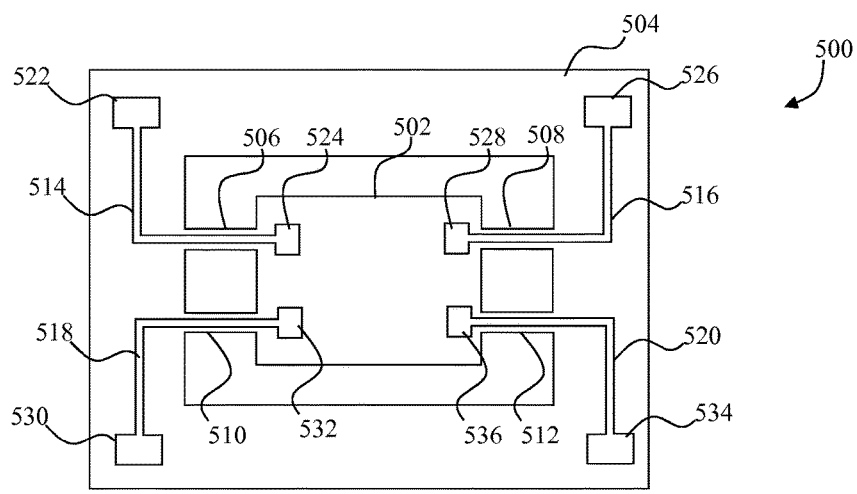
FIG. 39 depicts a top plan view of a sensor package incorporating a vibration isolating assembly in the form of substantial linear spring members.

The vibration isolating assembly realized by the above described process may be configured differently for various applications. By way of example, FIG. 39 depicts a top plan view of an inertial sensor assembly 500 which can be formed using the above described process. The inertial sensor assembly 500 includes a sensor 502 that is supported by a rigid outer housing 504 by a vibration isolating assembly including four spring members 506, 508, 510, and 512. Interconnects 514, 516, 518, and 520 extend along the spring members 506, 508, 510, and 512, respectively, so as to connect bond pads 522, 524, 526, 528, 530, 532, 534, and 536 as shown in FIG. 39. In some embodiments, one or more of the interconnects 514, 516, 518, and 520 are embedded within the spring members 506, 508, 510, and 512.

Figure 40:
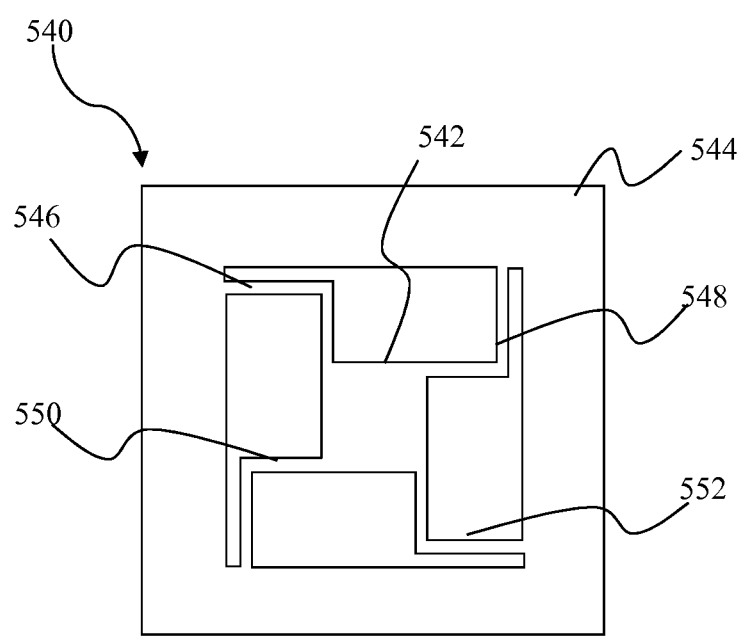
FIG. 40 depicts a top plan view of a sensor package incorporating a vibration isolating assembly in the form of "L" shaped spring members.

While the spring members 506, 508, 510, and 512 of FIG. 39 are substantially linear, increased vibration isolation is realized in some embodiments by using non-linear spring members which can also be formed using the above described process. FIG. 40 depicts a simplified top plan view of a sensor package 540 which includes a sensor 542 that is supported by a rigid outer housing 544 using a vibration isolating assembly including four "L" shaped spring members 546, 548, 550, and 552. By using L-shaped spring members 546, 548, 550, and 552, three linear axes of vibration and three angular axes of vibration can be effectively decoupled from the sensor.

Figure 41:
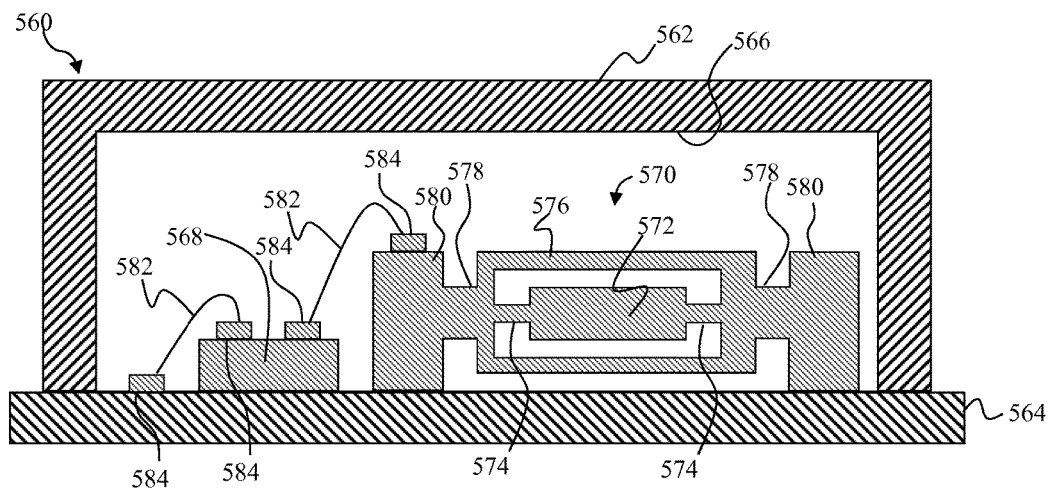
FIG. 41 depicts a sensor assembly including a sensor package and an ASIC chip encased within second level packaging which incorporates a vibration isolating assembly for the sensor package.

The above described process in some embodiments is modified to provide a different packaging scheme. FIG. 41 depicts a simplified cross-sectional view of a second level sensor assembly 560. A rigid cap 562 is fixed to a substrate 564. The cap 562 and a PCB substrate 564 define a cavity 566. An ASIC chip 568 and a sensor package 570 are located within the cavity 566.

Like the inertial sensor assembly 200, the sensor assembly 560 includes a sensor structure 572 that is suspended by spring supports 574, which are attached to a rigid outer portion 576. The rigid outer portion 576 is in turn vibrationally isolated from the substrate 564 by a vibration isolating assembly including spring members 578 which support the rigid outer portion 576 between anchors 580 which are fixed to the substrate 564. Wire bonds 582 connect various bond pads 584 to electronically connect the sensor package 570 to the ASIC 568 and other components. The sensor package 570 of the sensor assembly 200 is thus vibrationally isolated from the PCB substrate 564. The length and cross-section of the spring members 578 are configured to provide isolation from a particular interfering vibration.

Figure 42:
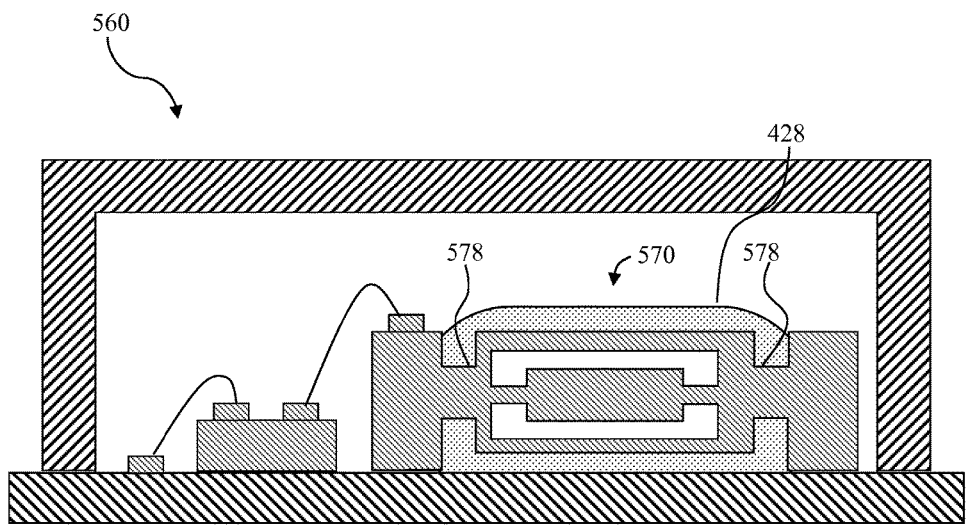
FIG. 42 depicts the sensor assembly of FIG. 41 with the sensor package embedded within a gel material.
Figure 43:
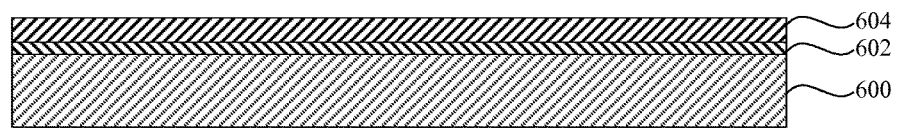
FIGS. 43-53 depict a process for fabricating a sensor assembly like the sensor assembly of FIG. 2 incorporating a sensor that is suspended from a rigid outer portion by a vibration isolating assembly incorporating spring members that decouple the sensor platform from external vibrations using an SOI wafer.

Damping of the sensor in the above described embodiments may be controlled using the atmosphere in which the sensor is suspended. The environment in some embodiments is established during the above described process, or following the steps described above by infusion of a desired atmosphere. In some embodiments, a gel is inserted during the above described process to provide damping. By way of example, FIG. 42 depicts the sensor assembly 560 with the sensor package 570 and spring members 578 are encased or set within a gel-like material 590. The gel-like material 590 allows for damping that is greater than can be provided by ambient gas. The consistency of the gel 590 is selected to provide isolation from a particular interfering vibration.

Figure 44:
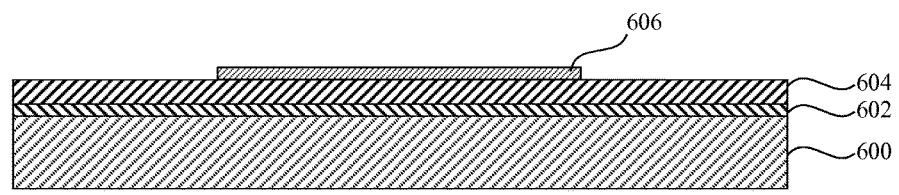
Figure 45:
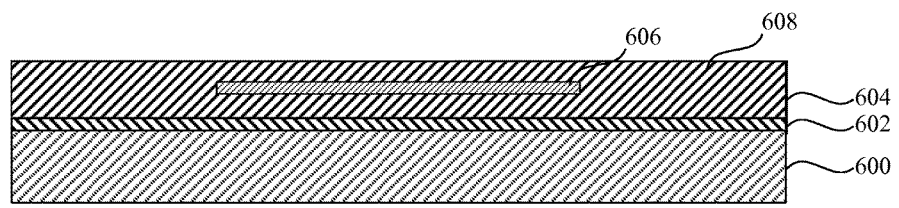

While the embodiment of FIGS. 3-38 used a silicon slab, sensors such as the sensor of FIG. 2 in some embodiments are formed from a silicon on oxide wafer. One such embodiment is depicted in FIGS. 43-52. Beginning at FIG. 43, a SOI wafer including a silicon layer 600, an oxide layer 602 and an oxide layer 604 is provided. Next, oxide 606 is deposited and patterned to form a sacrificial oxide layer for a sensor platform structure (FIG. 44). In FIG. 45, a silicon layer 608 is deposited and planarized for further lithography. This results in a patterned oxide layer embedded in a silicon layer. The oxide 606 is patterned as the shape of the sensor platform and spring supports.

Figure 46:
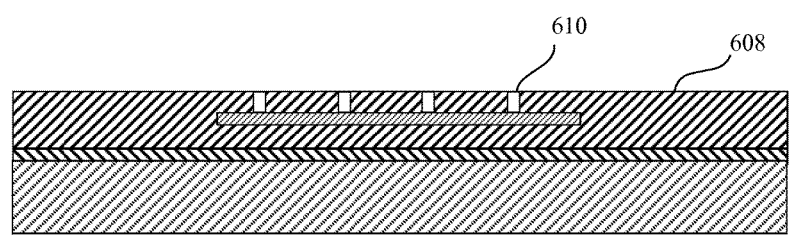
Figure 47:
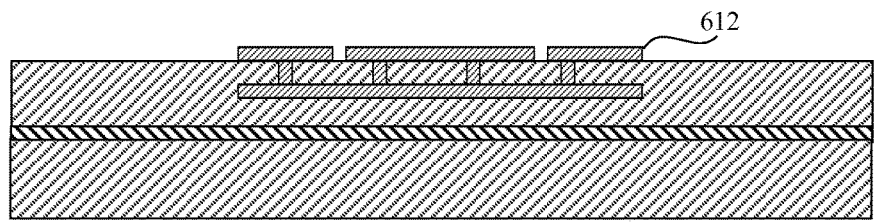
Figure 48:
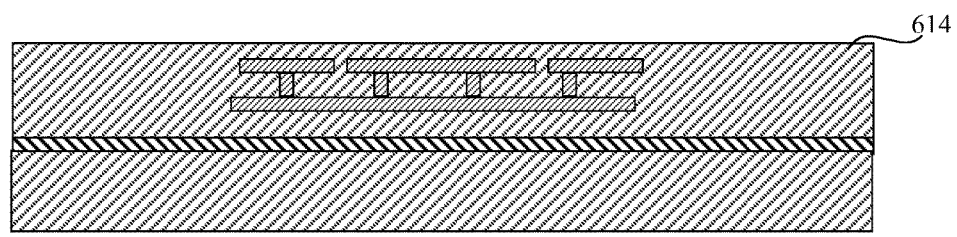
Figure 49:
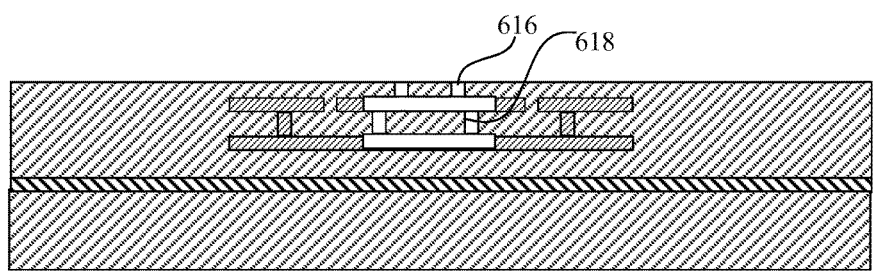
Figure 50:
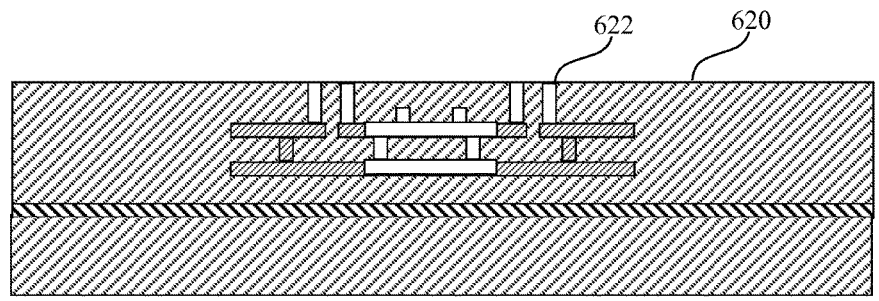

In FIG. 46, the silicon layer 608 is patterned with trenches 610. Another sacrificial oxide layer 612 is then deposited and patterned (FIG. 47). Silicon 614 is then deposited over the sacrificial oxide 612 (FIG. 48). Vent holes 616 are then formed and a vapor HF is used to etch the sacrificial oxide around the sensor element 618 to release the sensor element 618 (FIG. 49). In FIG. 50, the vent holes 616 are closed with a silicon deposition 620 and trenches 622 are formed to define electrical vias.

Figure 51:
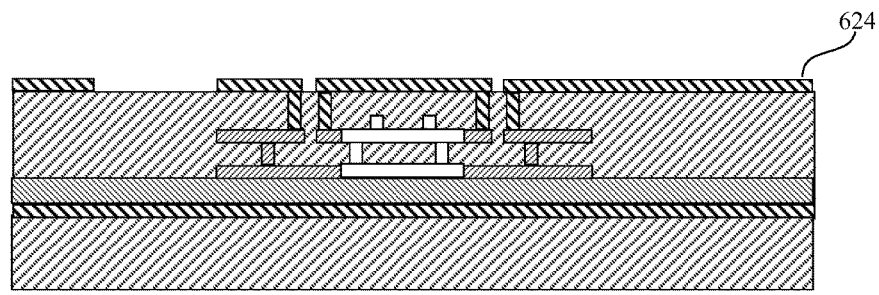
Figure 52:
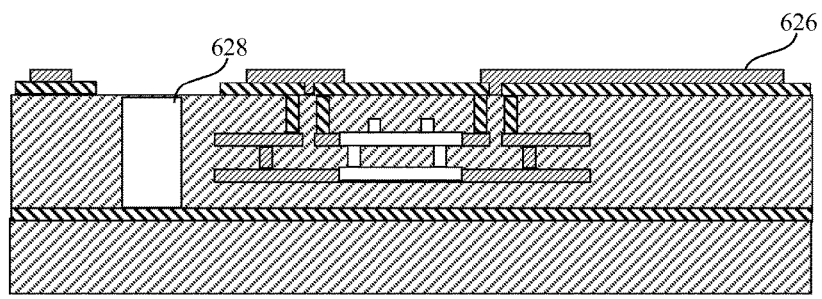
Figure 53:
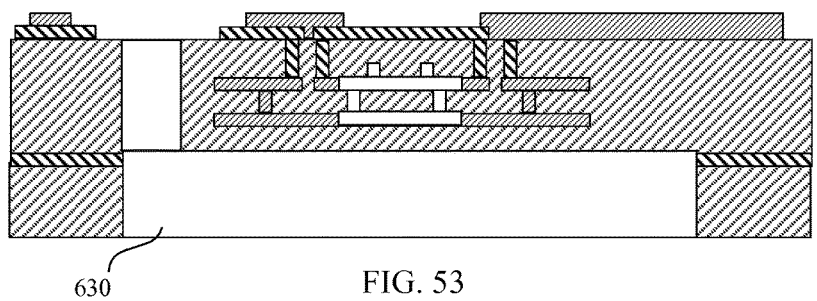

One the trenching is completed, passivation oxide 624 is deposited and patterned as depicted in FIG. 51. Metal 626 is then deposited and patterned for electrical connections and bond pads (FIG. 52) and the sensor platforms and spring supports are patterned by trench 628. The backside 630 is then removed for the sensor platform release (FIG. 53).

Figure 54:
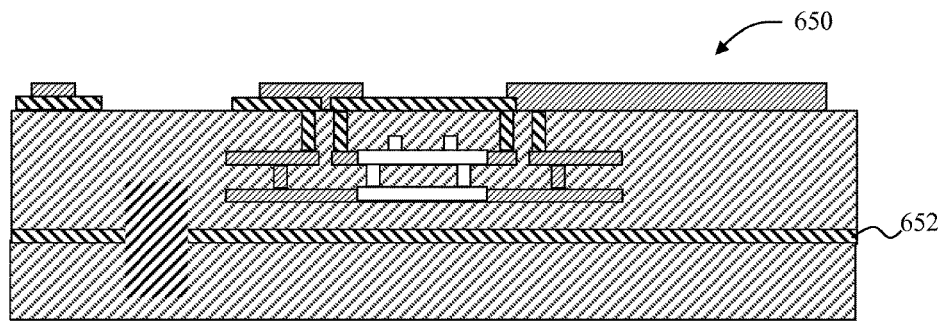
FIGS. 54-55 depict a process for fabricating a sensor assembly like the sensor assembly of FIG. 2 incorporating a sensor that is suspended from a rigid outer portion by a vibration isolating assembly incorporating spring members that decouple the sensor platform from external vibrations using an SOI wafer.
Figure 55:
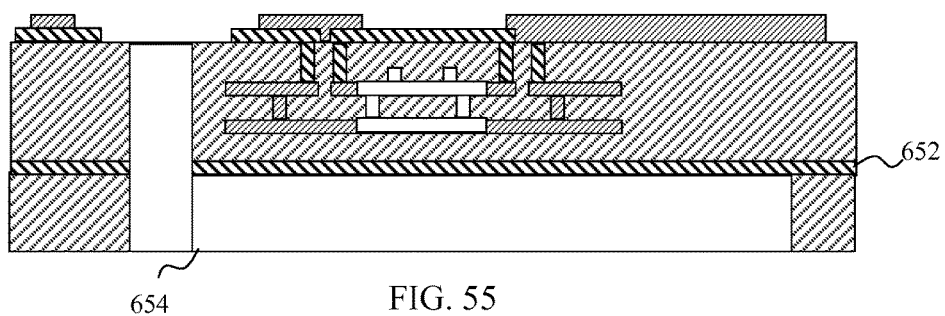

The foregoing process in some embodiments is modified. By way of example, FIG. 54 depicts a device 650 which is formed similarly to the device of FIGS. 43-53. The difference is that the oxide layer 652 is patterned and used as a buried hard mask. Accordingly, the sensor platform is released by trenching from the backside 654 and the etch is stopped by the oxide layer 652 to define the suspensions.

Figure 56:
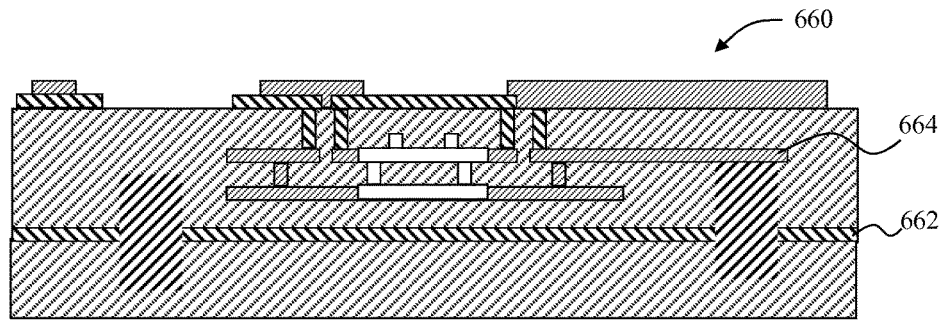
FIGS. 56-57 depict a process for fabricating a sensor assembly like the sensor assembly of FIG. 2 incorporating a sensor that is suspended from a rigid outer portion by a vibration isolating assembly incorporating spring members that decouple the sensor platform from external vibrations using an SOI wafer.
Figure 57:
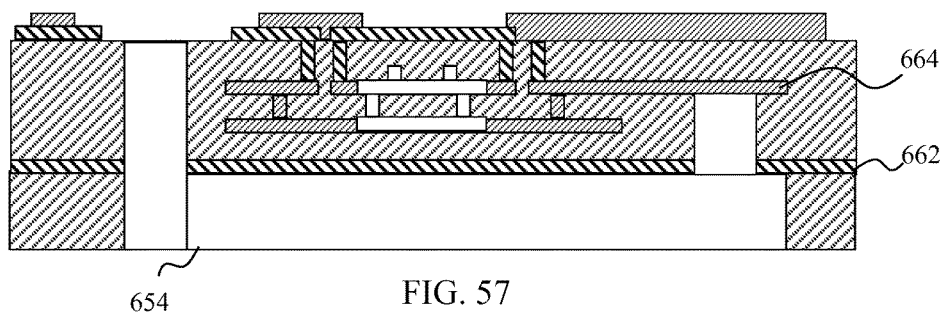

FIG. 56 depicts another embodiment wherein a device 660 includes a lowe oxide layer 662 which is patterned as the sensor platform hard mask and the sacrificial oxide layer 664 is patterned as a hard mask for a spring support. This allows for springs of different thicknesses to be realized. Consequently, when the device 660 is trenched from the backside 664 (FIG. 57), the buried oxide layer 662 and the sacrificial oxide layer 664 stop the etch is defined areas to define the suspensions. The thickness of the supports can thus be the same thickness as the cap layer thickness.

The above described embodiments and processes which are combined in various combinations thus provide a MEMS sensor chip which in some embodiments includes a decoupling element on the chip for decoupling undesired external vibrations and stresses from the MEMS sensing structure. Some of the embodiments allow for the decoupling of three axes of linear vibrations and/or three axes of angular vibrations.

In some embodiments, the MEMS sensor comprises a gyroscope, a gyroscope-accelerometer combination chip, a pressure sensor, or other sensor elements or combinations thereof. In some embodiments, the MEMS sensor chip includes a second level of packaging which couples in vibrations from the external environment.

In some embodiments, the undesired vibrations are decoupled between the second level of packaging and the rigid outer portion of MEMS sensor chip. In further embodiments, undesired vibrations which are coupled to the rigid outer portion of the MEMS sensor chip are decoupled from the suspended sensor platform within the MEMS sensor chip via a decoupling element.

The disclosed on-chip decoupling elements in various embodiments are micro-machined spring supports. The disclosed decoupling elements provide frequency tuning of the vibration decoupling by designing the high quality silicon micromachining processes. In some embodiments the damping behavior of the vibration isolation assembly is adjusted according to the desired application of the sensor.

In some embodiments, the vibration de-coupler is made of silicon.

In some embodiments including a rigid outer packaging portion, the spring supports, and the sensor platform are realized within a single silicon chip.

The above disclosed processes provide a rigid outer packaging portion, spring supports, and a sensor platform within a single MEMS process. The embodiments can be provided with second level packaging such as a metal-can package, a mold-premold package, a ceramic package, or an exposed-die-mold package.

The disclosed embodiments provide damping by controlling the atmospheric pressure to act in combination with the on-chip spring supports as a vibration de-coupler. In some embodiments, inner and outer cavities have different pressures to achieve the desired damping. In some embodiments, damping is provided by a gel that acts in combination with the on-chip spring supports as a vibration de-coupler.

In accordance with the above disclosure, the wiring from a de-coupled sensor platform to bond-pads on a rigid outer portion in some embodiments is accomplished using the spring supports. In some of these embodiments, the wiring from the suspended sensor to the bond-pads on rigid outer portion is done using the spring supports using a metal layer on top of the spring supports. In other embodiments, wiring from a suspended sensor to the bond-pads on a rigid outer portion is accomplished using the spring supports within the silicon itself so that the wiring is shielded from ground-referenced parasitic capacitances and so that environmental effects, such as humidity, will not affect the sensor functionality. In further embodiments, the wiring from the suspended sensor to the bond-pads on rigid outer portion is done with additional structures which have a spring constant that is much lower than that of the spring supports, so as to not affect the decoupling behavior of the chip. These embodiments are particularly useful for multi-axis sensor elements.

While the above described embodiments included a single sensor device, in some embodiments in accordance with the above described processes multiple sensors are provided such as an accelerometer and a gyroscope implemented side-by-side in suspended sensor platform. In other embodiments, the MEMS sensor includes an accelerometer realized within the rigid outer portion and a gyroscope implemented in the suspended region.

The above described processes can be easily modified for a particular application. In some processes, the inner structure is formed independently of the outer structure.

Accordingly, a sensor is fabricated with a wafer-level encapsulation approach. The sensor element is suspended by micro-machined spring supports from a rigid outer portion of the sensor. The spring supports act to decouple the sensor platform from the rigid outer portion, thereby negating the effects of external vibrations on the sensor element at the wafer level. Consequently, the sensor may be anchored directly to a mounting surface, such as a printed circuit board (PCB) substrate, instead of using further decoupling structures.

Sensor assemblies such as those described above exhibit reduced effects from external vibrations since the vibrations from the external environment are damped by the spring supports and are not coupled into the sensor element on the sensor. With proper design of the spring supports, both linear and rotational vibrations along multiple axes may be decoupled from the sensor.

This method can be easily implemented using existing packaging technologies with a few extra MEMS-process steps, resulting only a small increase in fabrication costs. Furthermore, the approach is adaptable to a variety of sensor types, such as gyroscopes or gyroscope-accelerometer combination chips. For example, for a gyroscope-accelerometer combination chip, the accelerometer can be implemented in the rigid outer portion of the sensor package, if no vibration decoupling is required, or on the suspended sensor with the gyroscope, if vibration decoupling is desired.

The overall damping behavior is entirely adjustable by simple layout changes. Since the device is fabricated using high quality standard MEMS micromachining processes, the damping behavior is very well definable and controllable. If different applications require different damping behavior, they can be effortlessly accommodated through small design changes.

The wiring from the suspended sensor to the rigid outer portion of the sensor package via the spring supports can be realized either with extremely low resistance metal wires on the spring supports, or using the silicon of the spring supports themselves. The described process allows for a wiring that is entirely ground referenced with respect to parasitic capacitances. Therefore, environmental influences, such humidity, will not affect the wiring.

While the disclosure has been illustrated and described in detail in the drawings and foregoing description, the same should be considered as illustrative and not restrictive in character. It is understood that only the preferred embodiments have been presented and that all changes, modifications and further applications that come within the spirit of the disclosure are desired to be protected.

The invention claimed is:

1. A sensor, comprising:
    a rigid wafer outer body;
    a first cavity located within the rigid wafer outer body;
    a first vibration isolating spring supported by the rigid wafer outer body and extending into the first cavity;
    a second vibration isolating spring supported by the rigid wafer outer body and extending into the first cavity; and
    a first sensor packaging supported by the first vibration isolating spring and the second vibration isolating spring within the first cavity.

2. The sensor of claim 1, wherein the first sensor packaging includes an encapsulated sensor element located within a second cavity.

3. The sensor of claim 2, wherein:
    the first cavity has a first pressure;
    the second cavity has a second pressure; and
    the first pressure is a different pressure from the second pressure.

4. The sensor of claim 2, further comprising:
    a second sensor packaging directly supported by the rigid wafer outer body.

5. The sensor of claim 2, further comprising:
    a second sensor packaging supported by the first vibration isolating spring and the second vibration isolating spring within the first cavity.

6. The sensor of claim 2, wherein:
    the first vibration isolating spring has a first spring constant;
    the second vibration isolating spring has a second spring constant; and
    the first spring constant is different from the second spring constant.

7. The sensor of claim 2, further comprising:
    at least one anchor; and
    at least one third spring extending from the at least one anchor and supporting the rigid wafer outer body, the at least one third spring integrally formed with the at least one anchor and the rigid wafer outer body.

8. The sensor of claim 2, wherein:
    the rigid wafer outer body includes a first portion of a silicon dioxide layer; and
    a second portion of the silicon dioxide layer is located at a bottom portion of the first sensor packaging.

9. The sensor of claim 2, further comprising:
at least one interconnect extending from the first sensor packaging into the rigid wafer outer body and supported by the first vibration isolating spring.

10. The sensor of claim 9, wherein the at least one interconnect is embedded within the first vibration isolating spring.

11. The senor of claim 2, wherein the encapsulated sensor element is formed from a middle device layer, the first sensor packaging further including:
a lower device layer directly beneath the encapsulated sensor element, the lower device layer mechanically and electrically isolated from the encapsulated sensor element; and
an upper device layer directly above the encapsulated sensor element, the upper device layer mechanically and electrically isolated from the encapsulated sensor element.

* * * * *